United States Patent [19]
Sato et al.

[11] Patent Number: 5,288,952
[45] Date of Patent: Feb. 22, 1994

[54] MULTILAYER CONNECTOR

[75] Inventors: Junichi Sato, Tokyo; Keiji Shinohara, Kanagawa, both of Japan

[73] Assignee: Sony Corporation, Tokyo, Japan

[21] Appl. No.: 815,060

[22] Filed: Dec. 30, 1991

[30] Foreign Application Priority Data

Dec. 28, 1990 [JP] Japan .................. 2-417115

[51] Int. Cl.⁵ .............................. H05K 1/00
[52] U.S. Cl. .............................. 174/262; 439/66
[58] Field of Search ............ 174/262, 263, 264; 361/414, 416; 439/66, 67, 70, 85

[56] References Cited

U.S. PATENT DOCUMENTS

| | | | |
|---|---|---|---|
| 3,967,371 | 7/1976 | Croset et al. | 174/262 X |
| 4,581,679 | 4/1986 | Smolley | 361/414 X |
| 4,713,494 | 12/1987 | Oikawa et al. | 361/414 X |
| 5,029,242 | 7/1991 | Sammet | 174/264 X |

FOREIGN PATENT DOCUMENTS 1-310591 12/1989 Japan ............................ 439/85

*Primary Examiner*—Lincoln Donovan
*Assistant Examiner*—Cheryl R. Figlin
*Attorney, Agent, or Firm*—Hill, Steadman & Simpson

[57] ABSTRACT

A multilayer connector is provided, in which at least a first wiring layer is formed, a second wiring layer is formed on the first wiring layer through an interlevel insulator, a contact hole is bored through the interlevel insulator at its portion in which the first and second wiring layers are connected, a coupling conductor is formed within the contact hole and the first and second wiring layers are electrically connected to each other by means of the coupling conductor. A recess portion having an opening is formed on the first wiring layer, the opening of the recess portion being increased in width from a peripheral edge of the contact hole, wherein the coupling conductor formed within the recess portion by a selective chemical vapor deposition process is formed within the contact hole of the interlevel insulator.

5 Claims, 2 Drawing Sheets

MULTILAYER CONNECTOR

BACKGROUND OF THE INVENTION

1. Field of the Invention

The present invention generally relates to multilayer connectors and, more particularly, is directed to a multilayer connector for use in ultra large scale integrated (ULSI) semiconductor device.

2. Description of the Prior Art

In a semiconductor integrated circuit such as a ULSI, a plurality of wiring layers must be laminated via an interlevel insulator between adjacent layers in accordance with the increase of integration level and of scale. For example, in the ULSI in which field effect transistors (FETs) constructing a memory cell as a circuit element are arrayed to form a predetermined circuit, a multilayer structure is frequently employed in which the respective electrodes of, for example, the FETs or the wiring layers are formed as an under layer or as a first wiring layer, a second wiring layer of a predetermined pattern is formed on the first wiring layer through an interlevel insulator and the upper second wiring layer is communicated with and coupled to the lower first wiring layer via an opening (contact hole) bored through the interlevel insulator in a predetermined connection relation.

In the case of the above-mentioned structure, in accordance with the increase of integration level and large scale, it is requested that the area of the contact hole bored through the interlevel insulator must be reduced as much as possible.

In the interlevel insulator, it is requested that the thickness of the interlevel insulator is increased to a certain extent in order to improve an insulating property and withstand voltage of the upper and lower wiring layers sandwiching the interlevel insulator, thereby the contact hole formed through the interlevel insulator for contact being increased in depth.

On the other hand, the second wiring layer of the upper layer is generally formed by the sputtering-process of Al (aluminum). In this case, it is difficult to insert the second wiring layer into the above-mentioned deep contact hole of small diameter with excellent coverage so that this second wiring layer is sufficiently brought in contact with the first wiring layer of the under layer electrically and mechanically. As a consequence, mis-contact, mis-coverage occur and a resistance value is increased, which unavoidably degrades the reliability.

For this reason, in the case of employing this kind of the multilayer wiring structure, before forming the second wiring layer of the upper layer, an Si layer is formed on the whole surface of the interlevel insulator involving the contact hole by a CVD (chemical vapor deposition) method. Thereafter, a so-called etch back is carried out to remove the Si layer on the interlevel insulator except the Si layer within the contact hole and then the second wiring layer of the upper layer is formed.

According to the above-mentioned structure, the first and second wiring layers are electrically coupled to each other by means of a coupling conductor formed of an Si layer filled into the contact hole of the interlevel insulator.

In accordance with this structure, however, since the coupling conductor is formed of the Si layer, the resistance value cannot be decreased sufficiently as compared with the metal and the etch back process is needed, which increases the number of working processes. As a result, the multilayer connector cannot be mass-produced efficiently.

Recently, a technology for selectively growing a metal having a high melting point such as tungsten W or the like has been developed. Therefore, it is proposed that metal having high melting point such as tungsten W or the like grown by the above-mentioned selective growing process is employed as the coupled conductor filled into the contact hole of the interlevel insulator.

The high melting point metal such as tungsten W or the like is selectively grown by the reduction of, for example, $WF_6$ gas. By selecting the growing conditions thereof, the growing speed is allowed to considerably increase on the conductive layer as compared with the insulating layer, thereby the selective growth being realized substantially. By effectively utilizing this selective growth, the tungsten W is selectively grown only on the second wiring layer of the under layer exposed to the outside through the contact hole of the interlevel insulator, thereby the coupled conductor made of tungsten W being formed so as to refill the contact hole.

According to the multilayer connector structure using the coupled conductor made of metal such as tungsten W or the like, the electrical resistance in this coupled portion is reduced, and the etch-back process is not required, which can therefore increase efficiency in working.

However, as shown in FIG. 1, according to this conventional method, if the first wiring layer 21 of the under layer is made of a material such as Al or the like which can be treated by the sputtering-process with ease, there is then the disadvantage such that the multilayer connector will be degraded in reliability.

That is, if a contact hole 2A is bored through an interlevel layer 2 made of material such as $SiO_2$ or the like, as shown in a longitudinal diagrammatic view of a section forming FIG. 2, the interlevel insulator 2 made of material such as $SiO_2$ or the like is formed on the whole surface of the first wiring layer 21 made of the Al under layer or the like and formed on a semiconductor substrate 1 having a surface insulating layer, for example. Then, an etching mask layer 3 made of photoresist or the like is formed on the interlevel insulator 2.

Through this etching mask layer 3, a contact hole 3A is formed on the contact hole forming portion by a well-known optical photography technique, i.e., the pattern exposure and development.

Then, as shown in FIG. 2, the mask layer 3 is employed as the mask and the contact hole 2A, which is substantially identical with the contact hole 3A of the mask layer 3, is bored through the interlevel insulator 2 via the contact hole 3A by the reactive ion etching (RIE) process.

In the next process, as shown in FIG. 3, the mask layer 3 is removed and the tungsten W is refilled only on the portion of the first wiring layer 21 of the under layer which portion is exposed to the outside through the contact hole 2A, that is, the tungsten W is refilled only into the contact hole 2A to thereby form a coupling conductor 4 made of tungsten W by the selective W-CVD method using $WF_6$ gas. A second wiring layer 22 of an upper layer of a predetermined pattern made of an Al layer or the like is formed on the interlevel insulator 2 involving the coupling conductor 4.

In this way, the first and second wiring layers 21 and 22 are electrically connected to each other by means of the coupling conductor 4 refilled into the contact hole 2A bored through the predetermined portion of the interlevel insulator 2.

However, according to the above conventional method, the anisotropy etching process forming the contact hole 2A on the interlevel insulator 2 is carried out by the RIE process having strong ion so that, when the contact hole 2A is bored, then the metal of the first wiring layer 21, e.g., Al is exposed by the sputtering-process. As a result, as shown in FIGS. 2 and 3, an unstable smudge 5 such as a so-call Al crown, Al particle or the like is deposited on the inner circumferential surface of the contact hole 2A. Under this state, if the coupling conductor 4 is formed within the contact hole 2A by, for example, the selective W-CVD process, then this coupling conductor 4 tends to be peeled off. Also, if the connection resistance between the first and second wiring layers is increased. Thus, the reliability of this conventional multilayer connector will be degraded.

OBJECTS AND SUMMARY OF THE INVENTION

Accordingly, it is an object of the present invention to provide an improved multilayer connector in which the aforementioned shortcomings and disadvantages encountered with the prior art can be eliminated.

More specifically, it is an object of the present invention to provide a multilayer connector which is high in reliability.

It is another object of the present invention to provide a multilayer connector in which first and second wiring layers can be electrically and mechanically coupled to each other stably in a low resistance contact fashion.

It is a further object of the present invention to provide a multilayer connector which can be produced at high efficiency.

As an aspect of the present invention, a multilayer connector is provided, in which at least a first wiring layer is formed, a second wiring layer is formed on the first wiring layer through an interlevel insulator, an opening is bored through the interlevel insulator at its portion in which the first and second wiring layers are connected, a coupling conductor is formed within the opening and the first and second wiring layers are electrically connected to each other by means of the coupling conductor. A recess portion having an opening is formed on the first wiring layer, the opening of the recess portion being increased in width from a peripheral edge of the contact hole, wherein the coupling conductor formed within the recess portion by a selective chemical vapor deposition process is formed within the contact hole of the interlevel insulator.

The preceding and other objects, features, and advantages of the present invention will become apparent from the following detailed description of an illustrative embodiment thereof when read in conjunction with the accompanying drawings, in which like reference numerals are used to identify the same or similar parts in the several views.

DESCRIPTION OF THE PREFERRED EMBODIMENT

A multilayer connector according to an embodiment of the present invention will hereinafter be described in detail with reference to the drawings.

Figure 1:
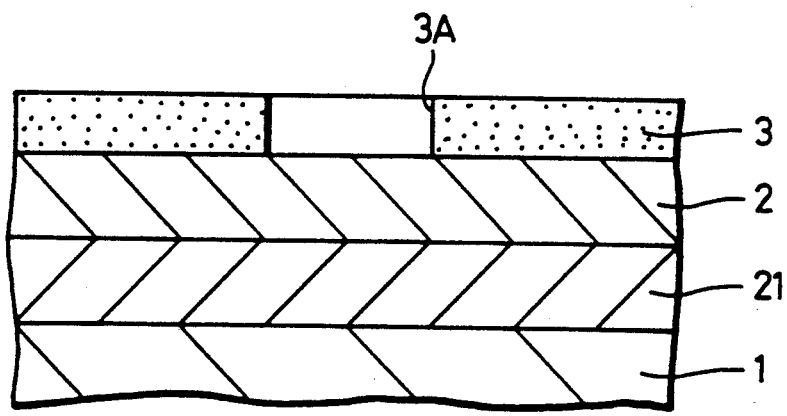
FIGS. 1 through 3 are respectively longitudinal diagrammatic view of section used to explain an example of a manufacturing process of a multilayer connector according to the prior art.
Figure 2:
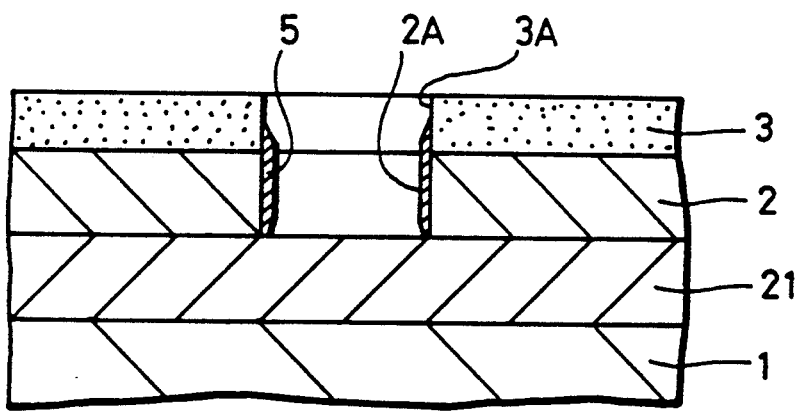
Figure 3:
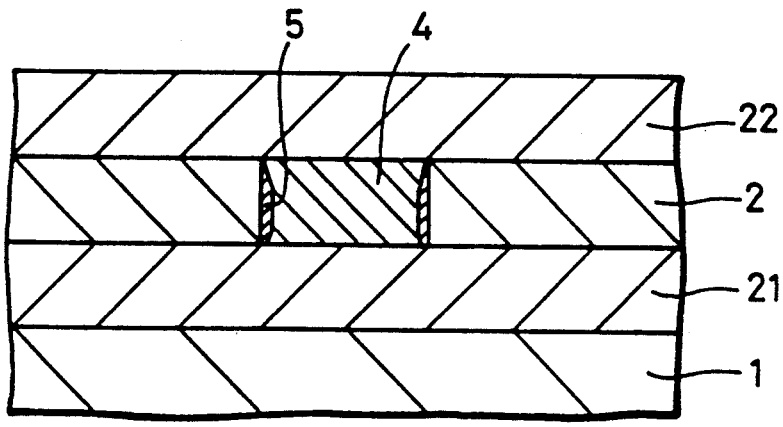
Figure 4:
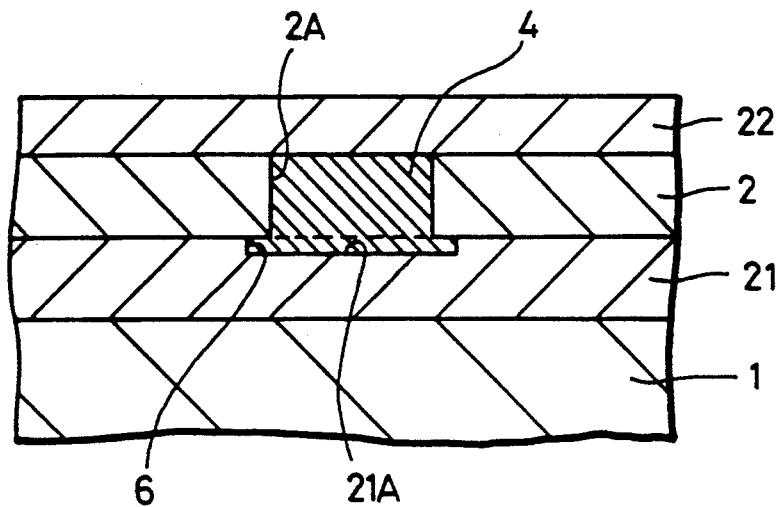
FIG. 4 is a longitudinal diagrammatic view of section showing a main portion of a multilayer connector according to an embodiment of the present invention in an enlarged scale.
Figure 5:
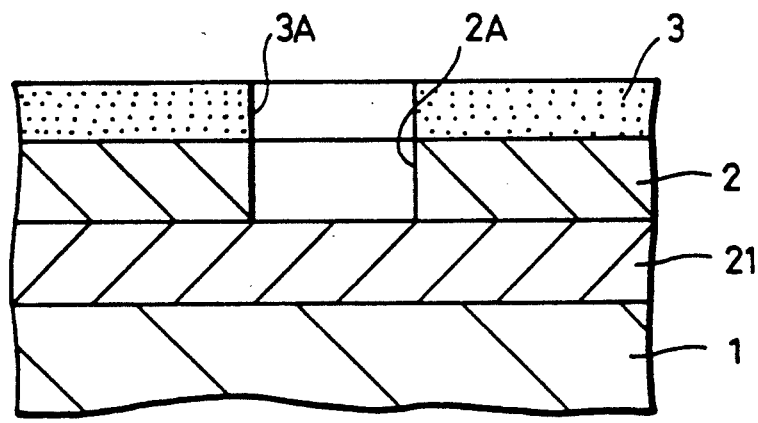
FIG. 5 is a schematic cross-sectional view used to explain the manufacturing process of the multilayer connector according to the embodiment of the present invention.
Figure 6:
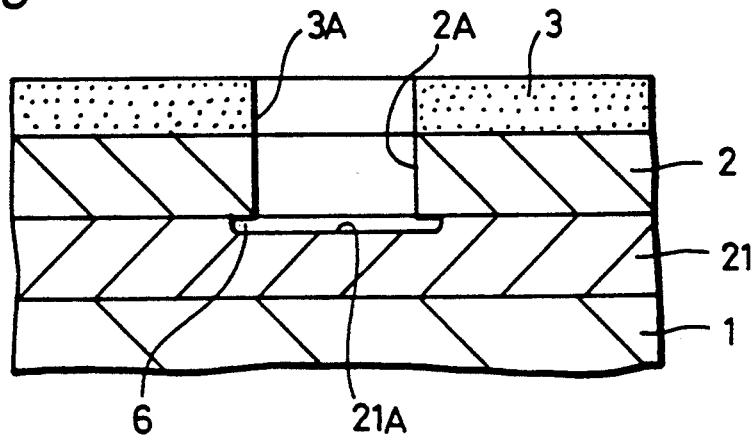
FIG. 6 is a schematic cross-sectional view used to explain the further manufacturing process of the multilayer connector according to the embodiment of the present invention.

FIG. 4 shows a schematic longitudinal diagrammatic view of section of the embodiment of the multilayer connector of the present invention in which the present invention is applied to a bilayer connector. In this case, in order to understand the bilayer connector of FIG. 4 more clearly, an example of the manufacturing method thereof also will be described with reference to FIGS. 5 and 6 forming schematic diagrammatic view of section in respective manufacturing processes. In FIGS. 4 through 6, like parts corresponding to those of FIGS. 1 to 3 are marked with the same references and therefore need not be described in detail.

Referring initially to FIG. 5, the first wiring layer 21 of a predetermined pattern made of, for example, an Al layer is formed on the semiconductor element having the surface insulating layer made of, for example, $SiO_2$ or the like, that is, on the semiconductor substrate 1 on which there is formed a memory cell or the like having, for example, the FET or the like.

Then, the interlevel insulator 2 made of $SiO_2$ or the like is formed on the whole surface of the first wiring layer 21 by the CVD method or the like. A photoresist, for example, is then coated on the whole surface of the interlevel insulator 2, exposed and then developed to form the contact hole 3A at a portion in which the first wiring layer 21 and a second wiring layer, which will be referred to later, are connected to each other and the mask layer 3 which serves as the etching resist is formed of the photoresist layer.

The interlevel insulator 2 made of, for example, $SiO_2$ is etched away by the RIE process in an anisotropy etching fashion through the contact hole 3A of the mask layer 3 under the condition that the ion is strong, thereby the contact hole 2A identical with the contact hole 3A being bored through the interlevel insulator 2.

The above-mentioned RIE process is carried out by supplying, for example, $CHF_3$ gas at the flow rate of 50 sccm into a reactive chamber under the pressure of 0.05 Torr and in the energy of $0.25W/cm^3$.

Then, as shown in FIG. 6, by the isotropic etching process based, for example, on the chemical wet etching process by utilizing the interlevel insulator 2 or in some case the mask layer 3 as an etching mask, the first wiring layer 21 made of Al (aluminum) is etched away through the contact holes 2A and 3A to thereby form a recess portion 21A having a thin expanded portion 6 expanded under the peripheral edge of the contact hole 2A.

Thereafter or before the recess portion 21A is formed, the mask layer 3 is removed and the selective W-CVD process is carried out to grow the tungsten W so as to refill the contact hole 2A including the inside of the recess portion 21A, thereby the coupling conductor 4 shown in FIG. 4 being formed.

The selective W-CVD process is carried out at, for example, a substrate temperature of 260° C. and by flowing $WF_6$ gas of the W source, reduced gas $SiH_4$ and carrier gas $H_2$ at flow rates of 10 sccm, 7 sccm and 100 sccm under the pressure of 0.2 Torr. According to the above-mentioned method, the tungsten W is hardly grown on the interlevel insulator 2 made of the insulating material and the tungsten W is grown only on the first wiring layer 21 made of the conductor material, i.e., Al, that is, within the recess portion 21A. It was experimentally confirmed that, at that time, the tungsten W is satisfactorily grown within the expanded portion 6 with the result that the tungsten W is refilled into the recess portion 21A and the contact hole 2A.

Then, the Al is formed, for example, on the whole surface of the interlevel insulator 2 in which the contact hole 2A is refilled by the coupling conductor 4 and whose surface is flattened. Then, the resultant product is treated by the pattern etching process based on the photolithography technique to thereby form the second wiring layer 22 of a predetermined pattern. As a consequence, the predetermined portions of the first and second wiring layers 21 and 22 are electrically coupled by means of the coupling conductor 4 made of tungsten W within the contact hole 2A and the recess portion 21A, thereby to form the bilayer connector.

While the present invention is applied to the bilayer structure formed of the first and second wiring layers 21 and 22 as described above, it is needless to say that the present invention can be applied to the multilayer connector in which the wiring layers are coupled at predetermined portions in the laminated structure of the wiring layers of three layers or more.

While the coupling conductor is made of tungsten W as described above, the present invention is not limited thereto and can be applied to the case such that the coupling conductor is made of other metals such as Mo, Cu or the like. Further, the respective wiring layers are not limited to Al and the interlevel insulator 2 is not limited to $SiO_2$ and may be formed of various insulating layers such as SiN layer or the like.

According to the arrangement of the present invention, the first and second wiring layers 21 and 22 are electrically coupled at the predetermined portion by the coupling conductor 4 formed in the contact hole 2A of the interlevel insulator 2. In this case, since the coupling conductor 4 is formed so as to become extended into the recess portion 21A having a large opening width formed on the first wiring layer 21 of the under layer, owing to the existence of the expanded portion 6 extended into the opening edge of the recess portion 21A, the coupling conductor 4 can be satisfactorily brought in contact with the first wiring layer 21 by the large contact area and also can be held within the contact hole 2A strongly.

Therefore, according to the present invention, as described in the preamble of the present invention, even if smudges such as Al crown or Al particles exist within the contact hole 2A of the interlevel insulator 2, the first and second wiring layers can be electrically and mechanically coupled to each other stably in a low resistance contact fashion and hence the reliability thereof can be improved.

Having described the preferred embodiment of the invention with reference to the accompanying drawings, it is to be understood that the invention is not limited to that precise embodiment and that various changes and modifications could be effected by one skilled in the art without departing from the spirit or scope of the novel concepts of the invention as defined in the appended claims.

What is claimed is:

1. A multilayer connector comprising:
   a first wiring layer;
   a second wiring layer formed on said first wiring layer through an interlevel insulator;
   a first opening bored through said interlevel insulator at a portion where said first and second wiring layers are connected;
   a recess portion having a second opening formed in the surface of said first wiring layer, said second opening of said recess portion being increased in width from a peripheral edge of said first opening and adjacent said first opening; and
   a coupling conductor extending from said recess portion to said first opening of said interlevel insulator and electrically connecting said first and second wiring layers.

2. A multilayer connector according to claim 1, in which said coupling conductor is made of tungsten W.

3. A multilayer connector according to claim 1, in which said coupling conductor is made of molybdenum Mo.

4. A multilayer connector according to claim 1, in which said coupling conductor is made of copper Cu.

5. A multilayer connector according to claim 2, in which said tungsten is selectively grown at a substrate temperature of 260° C. and by flowing $WF_1$ gas as a W source, a reducing gas $SiH_4$ and a carrier gas $H_2$ at respective flow rates of 10 sccm, 7 sccm and 100 sccm under a pressure of 0.2 Torr.

* * * * *